(12) United States Patent
Cheng (10) Patent No.: US 10,770,589 B2
(45) Date of Patent: Sep. 8, 2020

(54) FIN FIELD EFFECT TRANSISTOR INCLUDING A SINGLE DIFFUSION BREAK WITH A MULTI-LAYER DUMMY GATE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/106,429

(22) Filed: Aug. 21, 2018

(65) Prior Publication Data

US 2020/0066895 A1   Feb. 27, 2020

(51) Int. Cl.
   *H01L 29/78*      (2006.01)
   *H01L 29/66*      (2006.01)
   *H01L 27/088*     (2006.01)
   *H01L 21/8234*    (2006.01)

(52) U.S. Cl.
   CPC .... *H01L 29/785* (2013.01); *H01L 21/823431* (2013.01); *H01L 27/0886* (2013.01); *H01L 29/66545* (2013.01); *H01L 29/66795* (2013.01); *H01L 2029/7858* (2013.01)

(58) Field of Classification Search
   CPC .................................................. H01L 21/8234
   See application file for complete search history.

(56) References Cited

U.S. PATENT DOCUMENTS

| | | |
|---|---|---|
| 8,609,510 B1 | 12/2013 | Banna et al. |
| 8,846,491 B1 | 9/2014 | Pham et al. |
| 9,171,752 B1 | 10/2015 | Wu et al. |
| 9,406,676 B2 | 8/2016 | Yu et al. |
| 9,412,616 B1 | 8/2016 | Xie et al. |
| 9,431,396 B2 | 8/2016 | Zang et al. |
| 9,589,845 B1 | 3/2017 | Jagannathan et al. |
| 9,608,062 B1 | 3/2017 | Tseng et al. |
| 9,660,022 B2 | 5/2017 | Liou et al. |
| 2016/0336183 A1 | 11/2016 | Yuan et al. |
| 2018/0108569 A1* | 4/2018 | Zhao ............... H01L 21/823412 |
| 2019/0148373 A1* | 5/2019 | Shi ..................... H01L 21/31144 257/401 |

OTHER PUBLICATIONS

Pending U.S. Appl. No. 16/570,701, filed Sep. 13, 2019, entitled: "Fin Field Effect Transistor Including a Single Diffusion Break With a Multi-Layer Dummy Gate", 28 pages.

* cited by examiner

*Primary Examiner* — Yu-Hsi D Sun
(74) *Attorney, Agent, or Firm* — L. Jeffrey Kelly (57) ABSTRACT

In one example, a fin field effect transistor including a single diffusion break with a multi-layer dummy gate is disclosed. One example of field effect transistor includes a first transistor array comprising a first active gate, a second transistor array comprising a second active gate, and a single diffusion break formed between the first transistor array and the second transistor array, wherein the single diffusion break comprises a dummy gate comprising multiple layers of different materials.

19 Claims, 13 Drawing Sheets

FIN FIELD EFFECT TRANSISTOR INCLUDING A SINGLE DIFFUSION BREAK WITH A MULTI-LAYER DUMMY GATE

FIELD OF THE DISCLOSURE

The present disclosure relates generally to complementary metal-oxide-semiconductor technology and relates more specifically to fin field effect transistors with diffusion breaks.

BACKGROUND OF THE DISCLOSURE

Complementary metal-oxide-semiconductor (CMOS) devices often require isolation between adjacent arrays of transistors. In fin field effect transistor (finFET) technology, this may be accomplished by placing one or more dummy gates between adjacent fin arrays to form what is known as a "diffusion break." Diffusion breaks may take various forms.

In a double diffusion break (DDB), a single fin is cut, prior to gate patterning, to form two adjacent fin arrays having a gap in between. A dummy gate is formed on each side of the gap (i.e., on the gap-end of each fin array). This approach thus decouples fin patterning from gate formation and allows the dummy gates to be processed in a manner similar to the active gates.

In a single diffusion break (SDB), a single fin is cut, after gate patterning, to form two adjacent fin arrays having a gap in between. A single dummy gate is formed in the gap between the fin arrays. The reduction in the number of dummy gates formed in the gap (i.e., from two to one), relative to a DDB, allows for a denser circuit to be fabricated (as less space is consumed by dummy devices).

SUMMARY OF THE DISCLOSURE

In one example, a fin field effect transistor including a single diffusion break with a multi-layer dummy gate is disclosed. One example of field effect transistor includes a first transistor array comprising a first active gate, a second transistor array comprising a second active gate, and a single diffusion break formed between the first transistor array and the second transistor array, wherein the single diffusion break comprises a dummy gate comprising multiple layers of different materials.

In another example, a field effect transistor includes a substrate, a first transistor array formed on the substrate, where the first transistor array includes a first channel formed as a first fin and a first active gate wrapping around the first fin, a second transistor array formed on the substrate, where the second transistor array includes a second channel formed as a second fin and a second active gate wrapping around the second fin, and a single diffusion break formed between the first transistor array and the second transistor array, where the single diffusion break includes a dummy gate that includes a layer of dielectric material, where a top surface of the layer of the dielectric material sits higher than top surfaces of the first fin and the second fin, and an inactive gate formed over the layer of dielectric material, where the inactive gate, the first active gate, and the second active gate are formed from identical materials.

In another example, a method includes forming a single diffusion break in a channel, to break the channel into a first fin array and a second fin array, filling a space left by the diffusion break with a dielectric material, wherein a top surface of the dielectric material sits higher than a top surface of the channel, and forming an inactive gate over the dielectric material, where forming the inactive gate includes depositing a gate dielectric layer on the dielectric material and depositing a gate conductor layer formed on the gate dielectric layer.

BRIEF DESCRIPTION OF THE DRAWINGS

The teachings of the present disclosure can be readily understood by considering the following detailed description in conjunction with the accompanying drawings, in which:

FIGS. 1A-1M illustrate top-down views of an example field effect transistor during various stages of a fabrication process performed according to examples of the present disclosure;

To facilitate understanding, identical reference numerals have been used, where possible, to designate identical elements that are common to the Figures.

DETAILED DESCRIPTION

In one example, a fin field effect transistor (finFET) including a single diffusion break with a multi-layer dummy gate is disclosed. As discussed above, a single diffusion break (SDB) between transistor fin arrays in a fin field effect transistor (finFET) device allows for a denser circuit to be fabricated, relative to a double diffusion break (DDB). This is due to the fact that a SDB uses one dummy gate formed in the gap between the fin arrays, while DDB uses two dummy gates, which consume more space. However, because a SDB cuts the fin and forms the dummy gate after patterning of the active gates, the dummy gate is not processed in the same manner as the active gates. Instead, the region in which the fin cut is made is filled with a dielectric material after the cut is made. Consequently, the dielectric dummy gate formed in the region of the SDB may interfere with steps of the downstream device fabrication process (e.g., replacement metal gate processes) and may also undesirably increase variability among finFET devices fabricated in this manner.

Examples of the present disclosure provide a finFET device with a single diffusion break (SDB) between adjacent transistor arrays, in which a multi-layer dummy gate formed in the region of the SDB comprises an inactive gate dielectric/gate conductor (e.g., high-k/metal) gate formed over a dielectric fill. Further examples of the present disclosure provide a process for fabricating the finFET device including the multi-layer dummy gate (i.e., a dummy gate comprising multiple layers of different materials) in the region of the SDB. In one example, the dielectric fill portion of the dummy gate is recessed to a depth that is lower than a depth reached by the bottom surfaces of the fins. This approach allows the dummy gate to be processed in the same manner and at the same time as the active gates. Thus, interference of the SDB with the formation of the active gates is minimized, while device variability is also minimized.

FIGS. 1A-1M, 2A-2M, 3A-3M, and 4A-4I illustrate views of an example field effect transistor 100 during various stages of a fabrication process performed according to examples of the present disclosure. In particular, FIGS. 1A-1M illustrate top-down views of the example field effect transistor 100 during various stages of the fabrication process performed according to examples of the present disclosure. FIGS. 2A-2M illustrate corresponding cross sectional views of the example field effect transistor 100 of FIGS. 1A-1M, taken along line X-X' of FIG. 1A. FIGS. 3A-3M illustrate corresponding cross sectional views of the example field effect transistor 100 of FIGS. 1A-1M, taken along line Y-Y' of FIG. 1A. FIGS. 4A-4I illustrate corresponding cross sectional views of the example field effect transistor 100 of FIGS. 1E-1M, taken along line Z-Z' of FIG. 1E.

As such, when viewed in sequence, FIGS. 1A-1M, 2A-2M, 3A-3M, and 4A-4I also serve as a flow diagram for the fabrication process. In particular, FIGS. 1A-1M, 2A-2M, 3A-3M, and 4A-4I illustrate a process by which a finFET device including a single diffusion break may be fabricated.

Figure 1A:
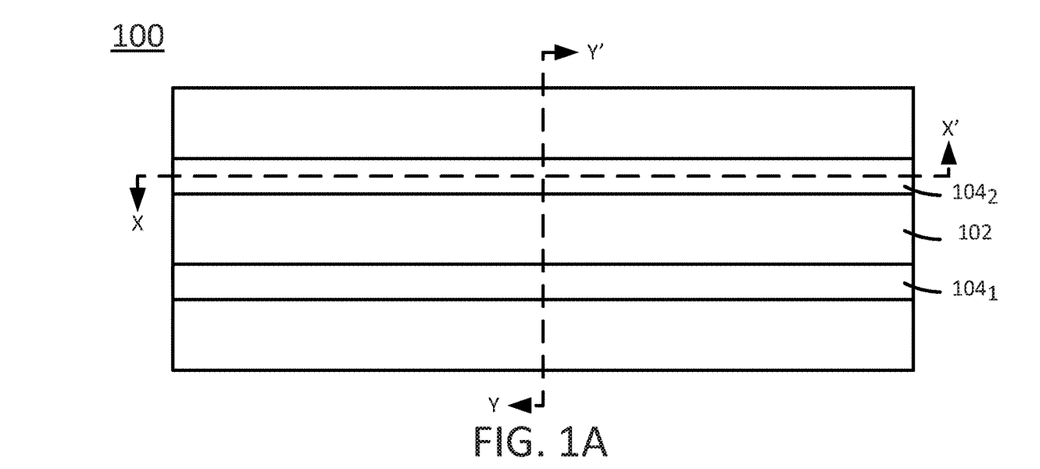
Figure 2A:
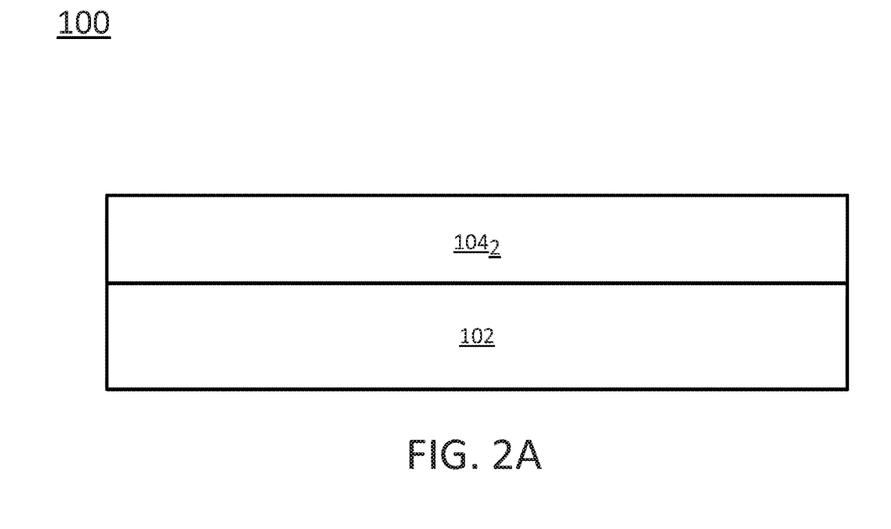
FIGS. 2A-2M illustrate corresponding cross sectional views of the example field effect transistor of FIGS. 1A-1M, taken along line X-X' of FIG. 1A.
Figure 3A:
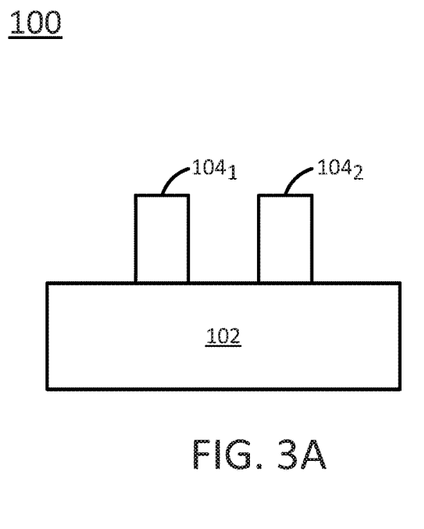

Referring to FIGS. 1A, 2A, and 3A, one or more fins $104_1$-$104_2$ (hereinafter individually referred to as a "fin 104" or collectively referred to as "fins 104") may be formed on a substrate 102. The substrate 102 may be formed from a semiconductor material, such as bulk silicon or silicon-on-insulator (SOI). The fins 104 may be formed from any suitable semiconductor materials, including, but not limited to, silicon, germanium, silicon germanium, Groups III-V compound semiconductors (e.g., gallium arsenide), Groups II-VG compounds semiconductors, or other like semiconductors. In some examples, the fins 104 are formed from the same material as the substrate 102. For example, both the substrate 102 and the fins 104 may comprise silicon. In other examples, the fins 104 may be formed from a different material than the substrate 102. For example, the substrate may comprise silicon, while the fins 104 may comprise silicon germanium formed by epitaxially growing silicon germanium on the silicon substrate 102 and subsequently patterning the epitaxial growth to form the fins 104. In another example, the fins 104 may be formed by lithography, followed by etching. Other suitable techniques, such as sidewall image transfer (SIT), self-aligned double patterning (SADP), self-aligned multiple patterning (SAMP), and self-aligned quadruple patterning (SAQP) can also be used to form the fins 104.

The fins will eventually form the channels of the FET 100. In the event that the substrate 102 is formed from bulk silicon, an isolation (e.g., a shallow trench isolation (STI)) area may be formed after formation of the fins 104. It should be noted that the fins 104 illustrated in FIGS. 1A, 2A, and 3A have not yet been cut, i.e., no diffusion break has yet been formed. Although the example FET 100 illustrated in FIGS. 1A, 2A, and 3A includes two fins 104, any number of fins may be included, including a single fin or three or more fins. In one example where the FET 100 includes multiple fins 104, all of the fins 104 may be formed of the same material (e.g., all fins formed of silicon, or all fins formed of silicon germanium). In another example where the FET 100 includes multiple fins 104, the fins 104 may be formed of different materials (e.g., some fins may be formed of silicon, while other fins may be formed of silicon germanium).

Figure 1B:
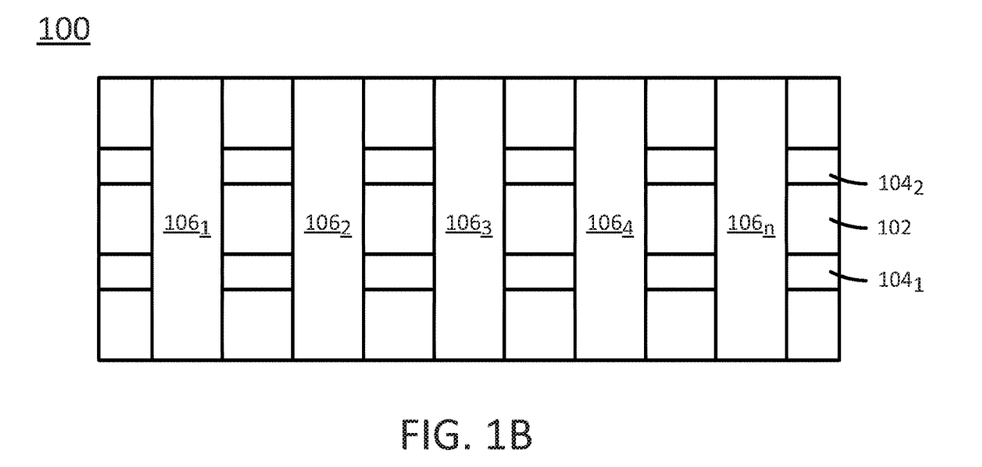
Figure 2B:
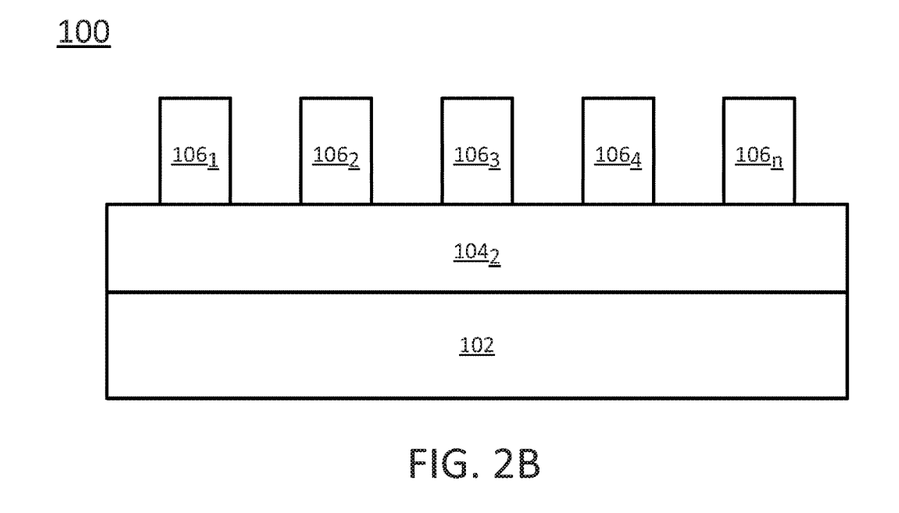
Figure 3B:
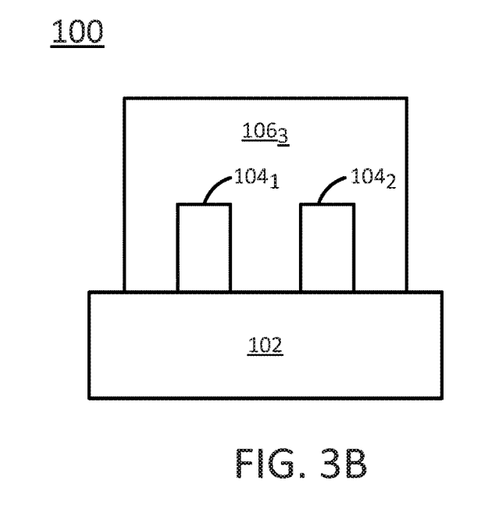

Referring to FIGS. 1B, 2B, and 3B, a plurality of dummy gates $106_1$-$106_n$ (hereinafter individually referred to as a "dummy gate 106" or collectively referred to as "dummy gates 106") may next be formed over the fins 104, e.g., so that the dummy gates 106 wrap around the fins 104 on three sides as illustrated. Each of the dummy gates 106 may be formed from a single material or may be formed from layers of different materials (e.g., a gate oxide, a gate, and a gate cap, where the gate may be formed from amorphous silicon and the gate cap may be formed from silicon nitride or multiple layers of different dielectric materials such as silicon oxide and silicon nitride). Although the example FET 100 illustrated in FIGS. 1B, 2B, and 3B includes five dummy gates 106, any number of dummy gates that is three or greater may be included. Three dummy gates is the lower limit in this case, as the final FET will include at least two transistor arrays separated by a diffusion break. Each transistor array will include at least one active gate, while the diffusion break will include one inactive gate.

Figure 1C:
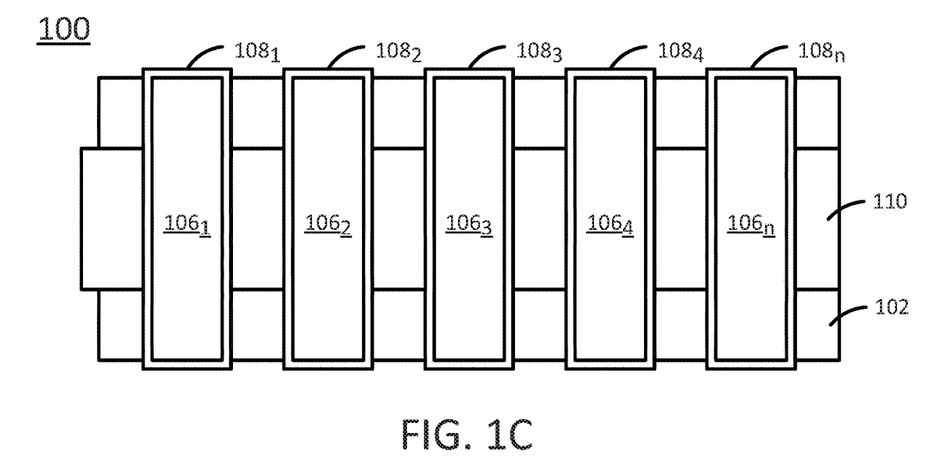
Figure 2C:
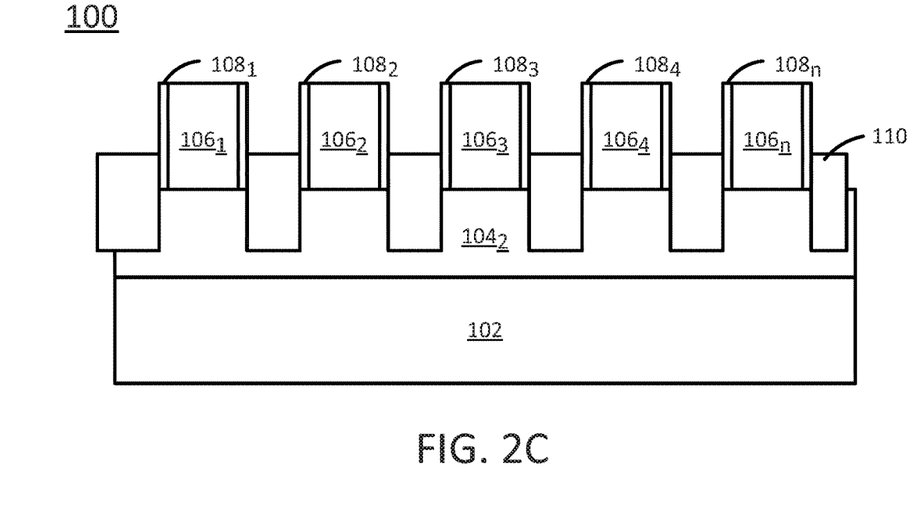
Figure 3C:
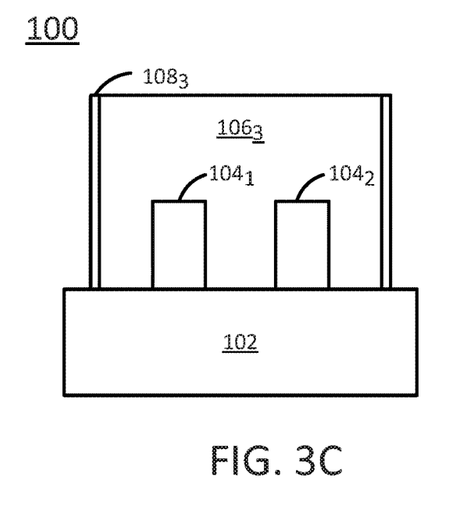

Referring to FIGS. 1C, 2C, and 3C, a plurality of spacers $108_1$-$108_n$ (hereinafter individually referred to as a "spacer 108" or collectively referred to as "spacers 108") may next be formed around the dummy gates 106. In one example, one spacer 108 is formed around each dummy gate 106. The spacers 108 may be formed, for example, through conformal deposition and directional etch processes. Deposition processes may include, but are not limited to, atomic layer deposition (ALD) and chemical vapor deposition (CVD). Directional etch processes may include, but are not limited to, RIE. Some examples of spacer materials include, but are not limited to, silicon nitride, silicon carbide, silicon oxynitride, carbon-doped silicon oxide, silicon-carbon-nitride, boron nitride, silicon boron nitride, silicoboron carbonitride, silicon oxycarbonitride, silicon oxide, and combinations thereof. Dielectric materials may include low-k dielectric materials (e.g., having a dielectric constant of less than approximately seven, and in one example approximately five).

In addition, an epitaxial layer 110 is grown over the fins 104, between the dummy gates 106. The epitaxial layer 110 will eventually form part of the source and drain regions of the FET 100. In some examples, epitaxial silicon, silicon germanium, germanium, and/or carbon-doped silicon can be doped during deposition (e.g., in situ doped) by adding n-type dopants (e.g., phosphorous or arsenic) or p-type dopants (e.g., boron or gallium), depending on the type of transistor to be formed. The dopant concentration in the source/drain regions can range from $1 \times 10^{19}$ cm$^{-3}$ to $3 \times 10^{21}$ cm$^{-3}$, and in another example is between $2 \times 10^{20}$ cm$^{-3}$ and $3 \times 10^{21}$ cm$^{-3}$. Other doping techniques can also be used to incorporate dopants in the source/drain regions, including, but not limited to, ion implantation, gas phase doping, plasma doping, plasma immersion ion implantation, cluster doping, infusion doping, liquid phase doping, solid phase doping, in situ epitaxy growth, or any suitable combination thereof.

Figure 1D:
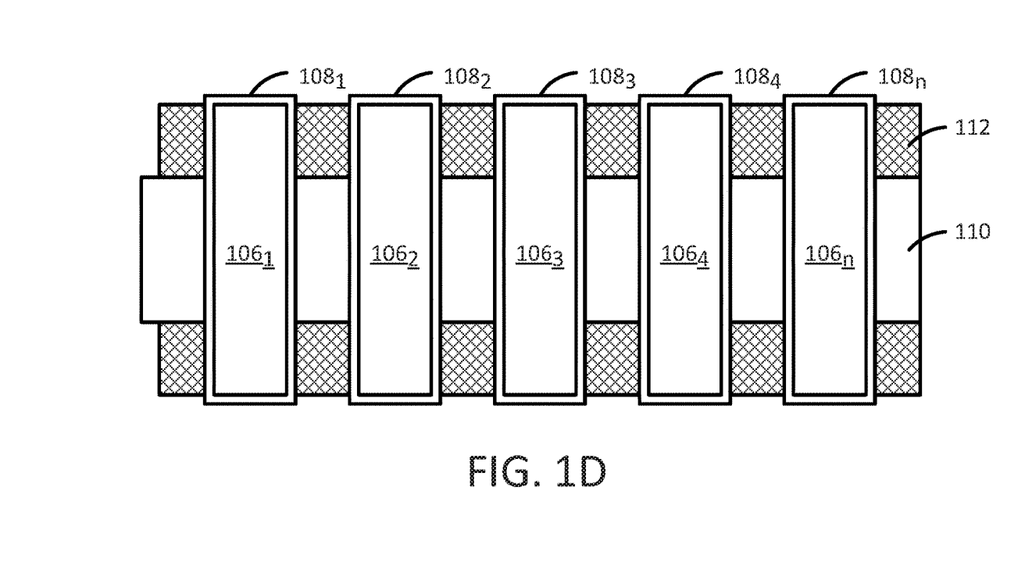
Figure 1F:
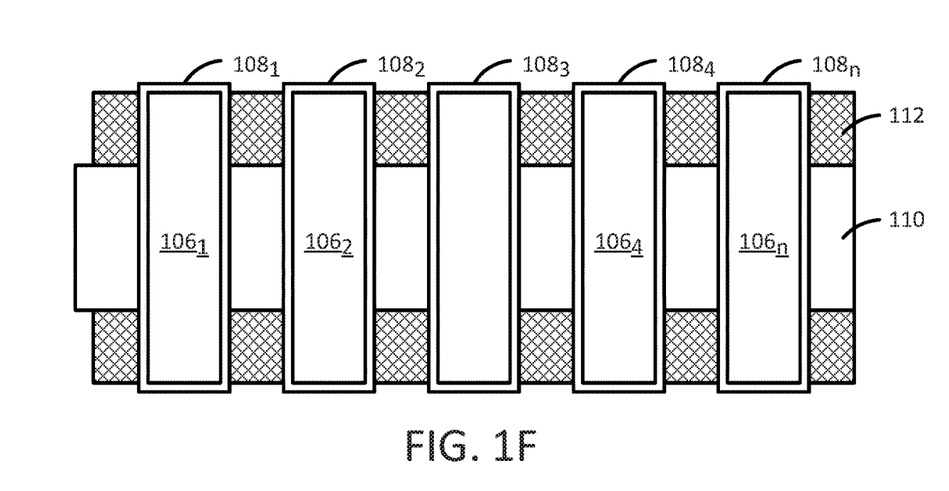
Figure 1G:
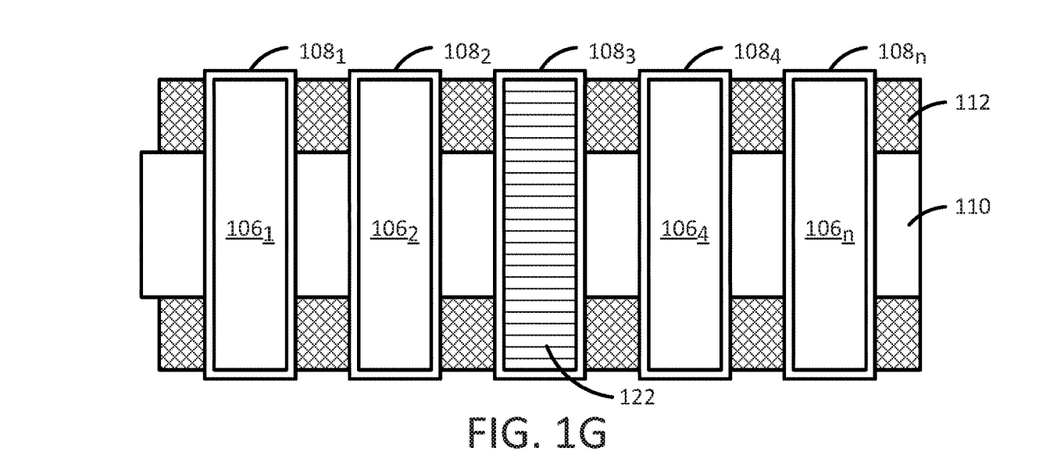
Figure 1H:
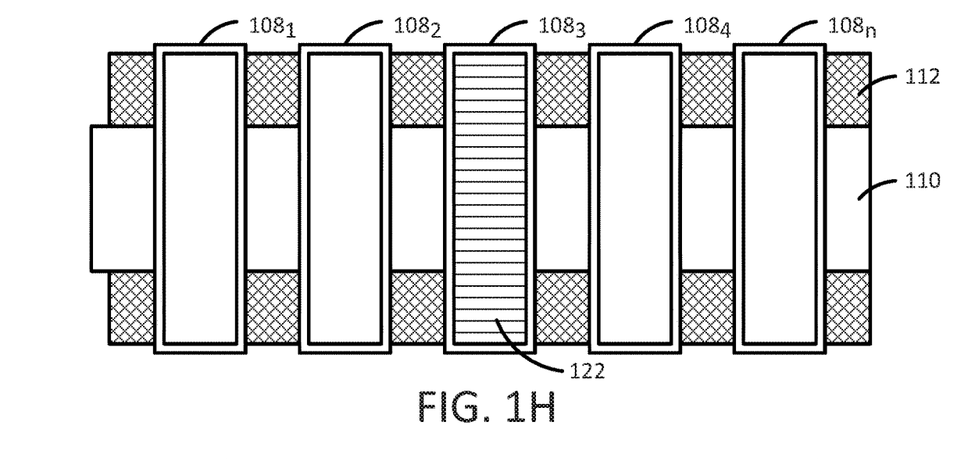
Figure 1I:
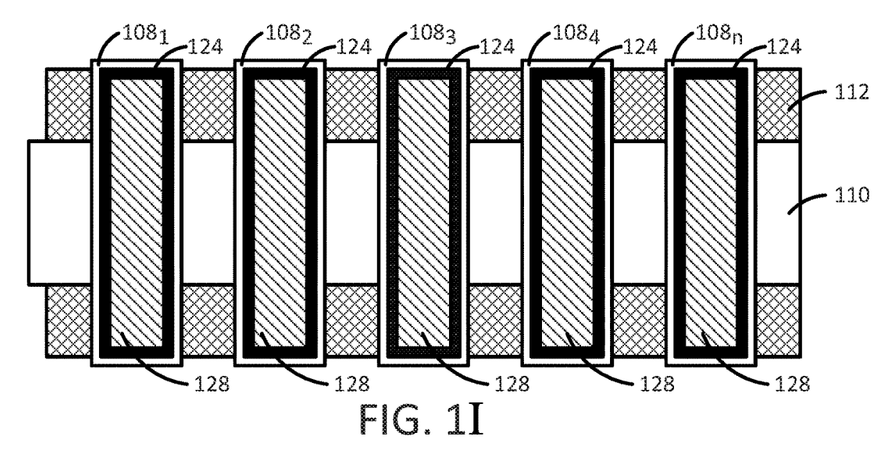
Figure 1J:
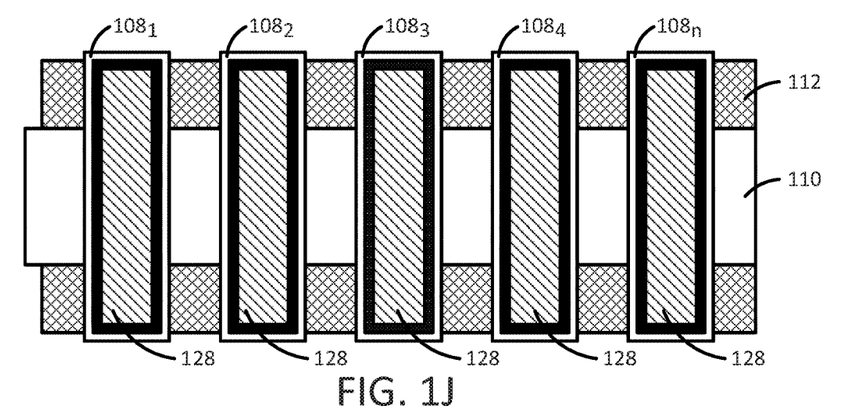
Figure 1K:
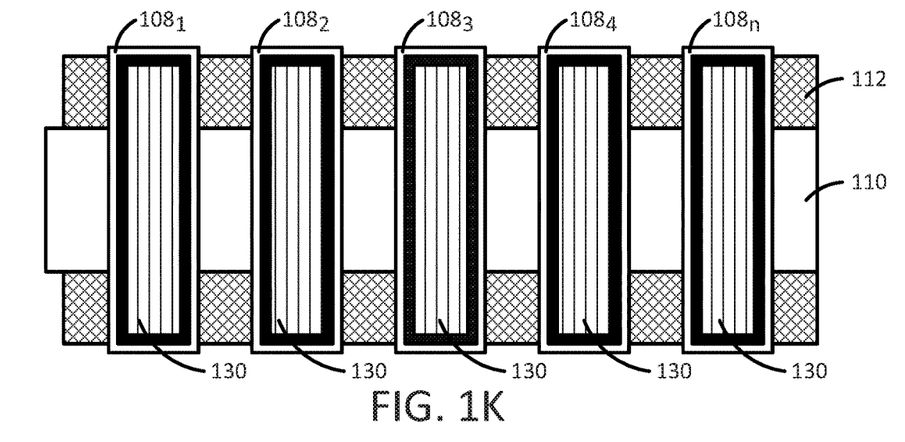
Figure 2D:
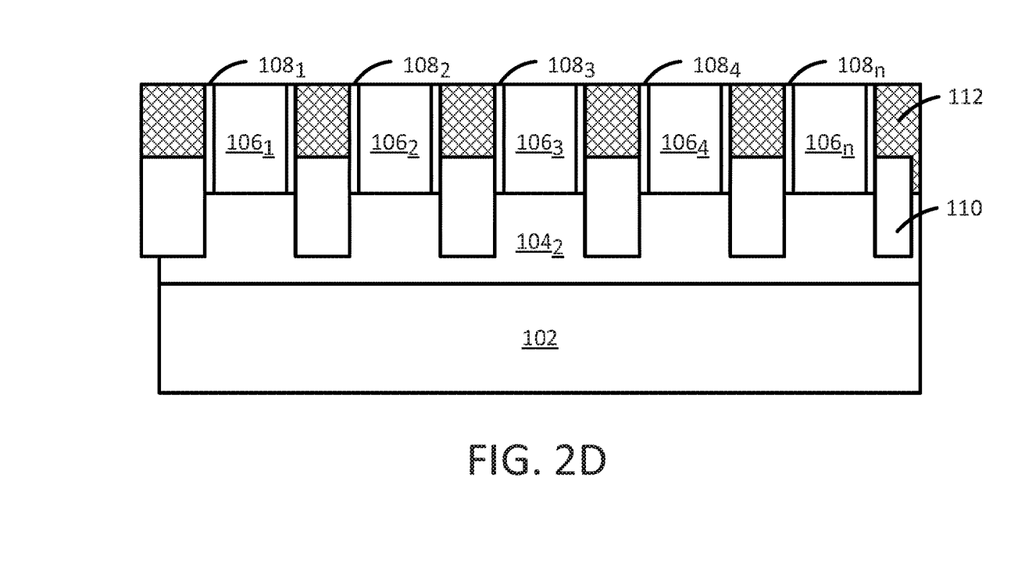
Figure 3D:
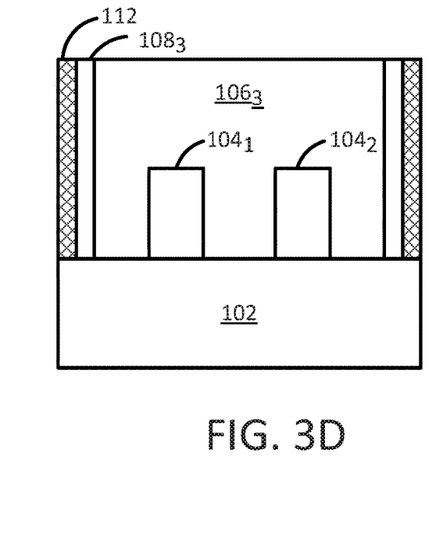

Referring to FIGS. 1D, 2D, and 3D, an interlevel dielectric layer 112 may next be formed over the substrate 102, in the spaces between the dummy gates 106, and over the epitaxial layer 110 (however, the interlevel dielectric layer 112 is not shown over the epitaxial layer of FIG. 1D for clarity. The interlevel dielectric layer 112 may be formed from a dielectric material, such as silicon nitride and/or a flowable oxide. In one example, the dielectric material is deposited over the substrate 102 and then planarized (e.g., down to the tops of the dummy gates 106).

Figures 2E, 3E:
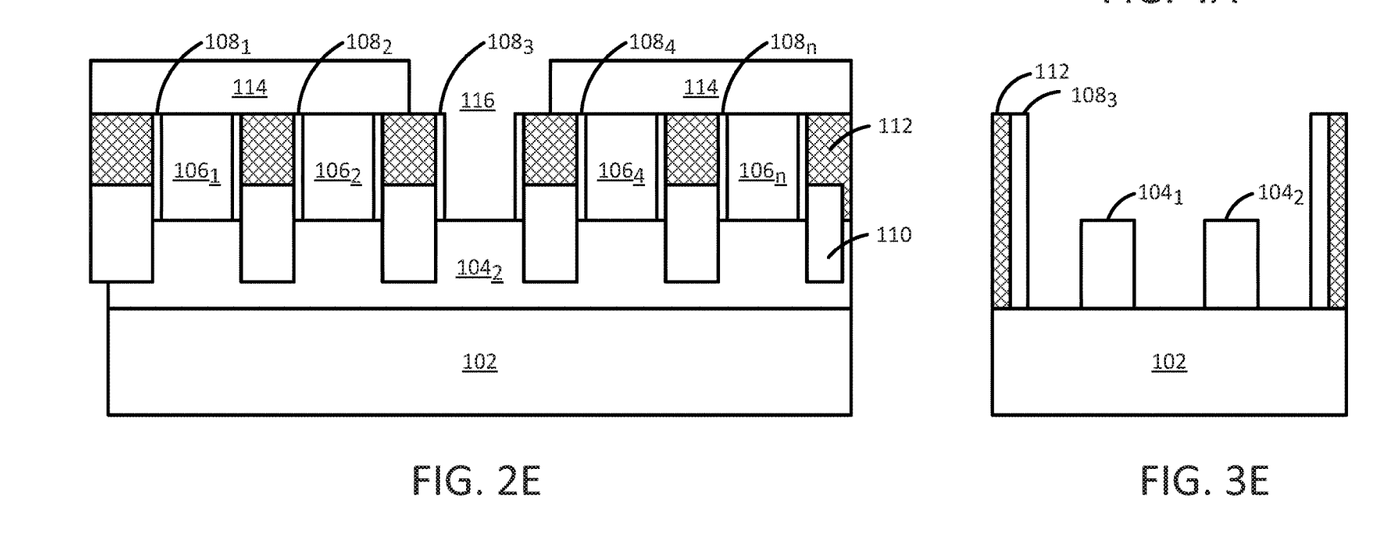
FIGS. 3A-3M illustrate corresponding cross sectional views of the example field effect transistor of FIGS. 1A-1M, taken along line Y-Y' of FIG. 1A.
Figures 2E, 4A:
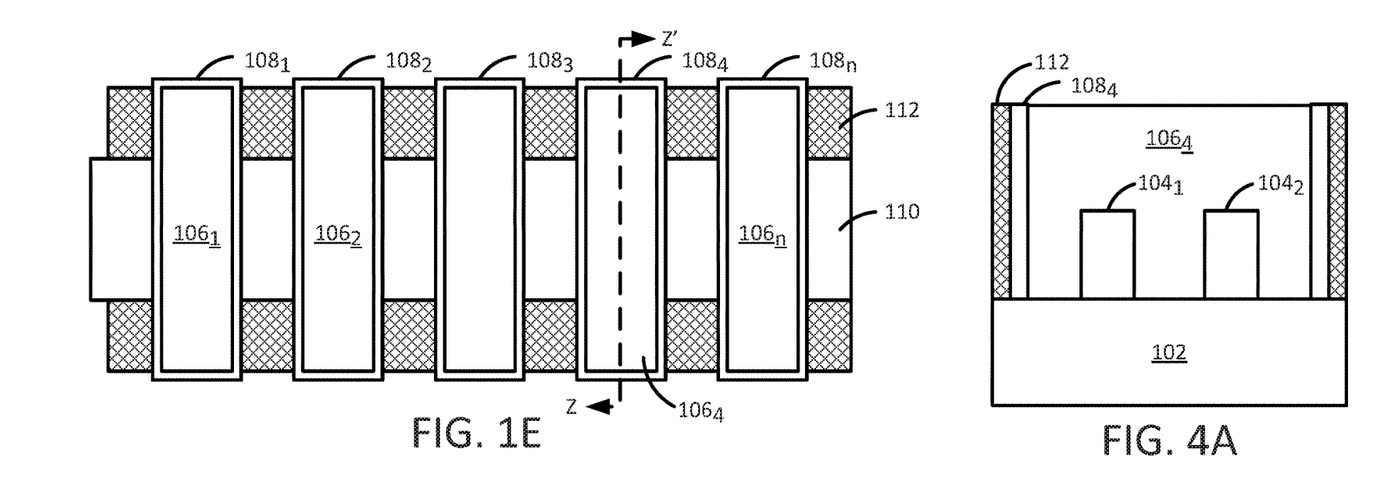
FIGS. 4A-4I illustrate corresponding cross sectional views of the example field effect transistor of FIGS. 1E-1M, taken along line Z-Z' of FIG. 1.

Referring to FIGS. 1E, 2E, 3E, and 4A, an etch mask 114 may next be formed over the dummy gates 106 and over the interlevel dielectric layer 112 (the etch mask 114 is not shown in FIG. 1E or 4A for clarity). The etch mask 114 may comprise a soft mask material (e.g., photoresist, optical planarization layer (OPL), or the like) or a hard mask material (e.g., silicon nitride or the like). The etch mask 114 may include an opening 116 over a first dummy gate 106 of the plurality of dummy gates 106 (i.e., where the first dummy gate is dummy gate $106_3$ in the illustrated example) and over portions of the interlevel dielectric layer 112 surrounding the first dummy gate $106_3$. The first dummy gate $106_3$ may reside over approximately the center of the fins 104 (i.e., where the center is measured along the longest dimensions of the fins 104). The first dummy gate $106_3$ is then removed, for instance via RIE, wet etch, plasma etch, or any suitable combination thereof, as shown in FIGS. 1E, 2E, and 3E. As shown in FIG. 4A, the remaining dummy gates 106 (i.e., dummy gates $106_1$, $106_2$, $106_4$, and $106_n$ in the illustrated example) are not removed in this step, as the remaining dummy gates are protected by the etch mask 114. Although FIG. 4A illustrates a cross section taken along remaining dummy gate $106_4$, the illustration is also representative of the cross sections that may be taken along the other remaining dummy gates (i.e., dummy gates $106_1$, $106_2$, and $106_n$).

Figure 2F:
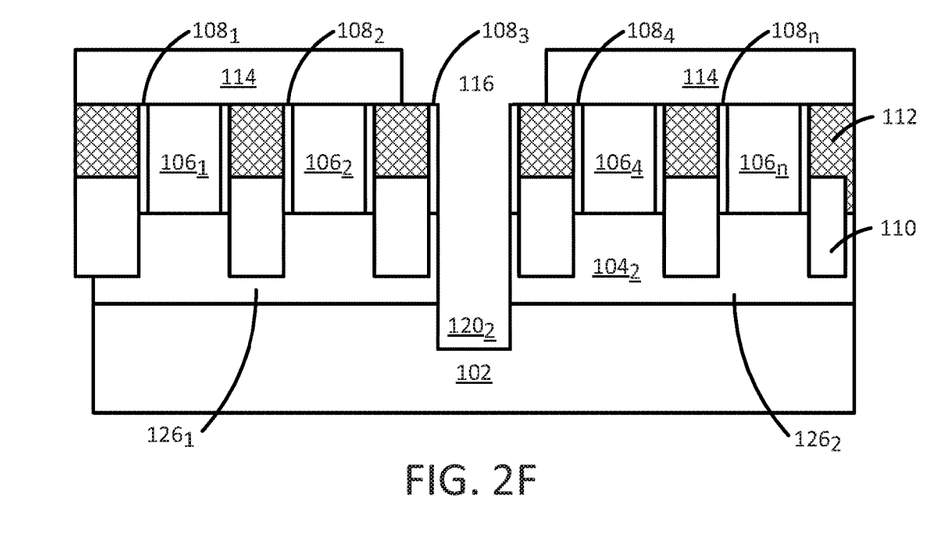
Figure 3F:
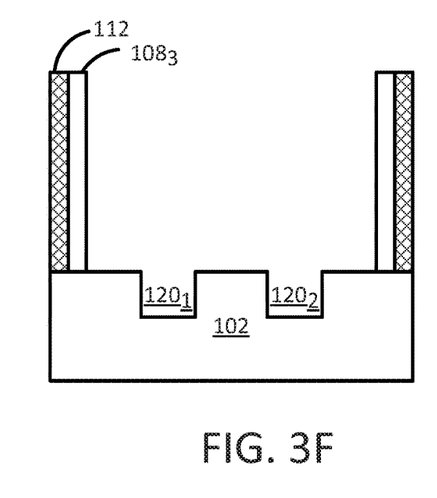
Figure 4B:
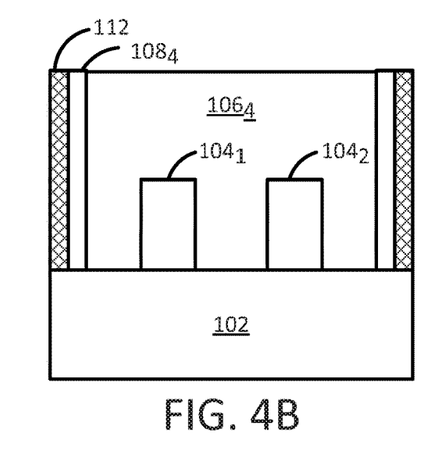

Referring to FIGS. 1F, 2F, 3F, and 4B, a single diffusion break may next be formed in the region of the removed first dummy gate $106_3$. In one example, the single diffusion break is formed by removing portions of the fins 104 that are left exposed in the region below the etch mask opening 116 (i.e., below where the removed first dummy gate $106_3$ sat). In one example, the portions of the fins 104 may be removed via a RIE process. In one example, the removal of the portions of the fins 104 may also remove a portion of the substrate 102, creating a recess $120_1$-$120_2$ (hereinafter individually referred to as a "recess 120" or collectively referred to as "recesses 120") in the substrate 102 below each removed fin portion, as shown in FIGS. 2F and 3F. This results in each fin 104 being split or broken into two separate, adjacent fin arrays $126_1$ and $126_2$ (hereinafter individually referred to as a "fin array 126" or collectively referred to as "fin arrays 126," and taking fin $104_2$ of FIG. 2F as an example), where the fin arrays 126 are separated by a recess 120. As shown in FIG. 4B, no substantial change is made to the remaining dummy gates 106 (i.e., dummy gates $106_1$, $106_2$, $106_4$, and $106_n$ in the illustrated example) in this step, as the remaining dummy gates are still protected by the etch mask 114.

Figure 2G:
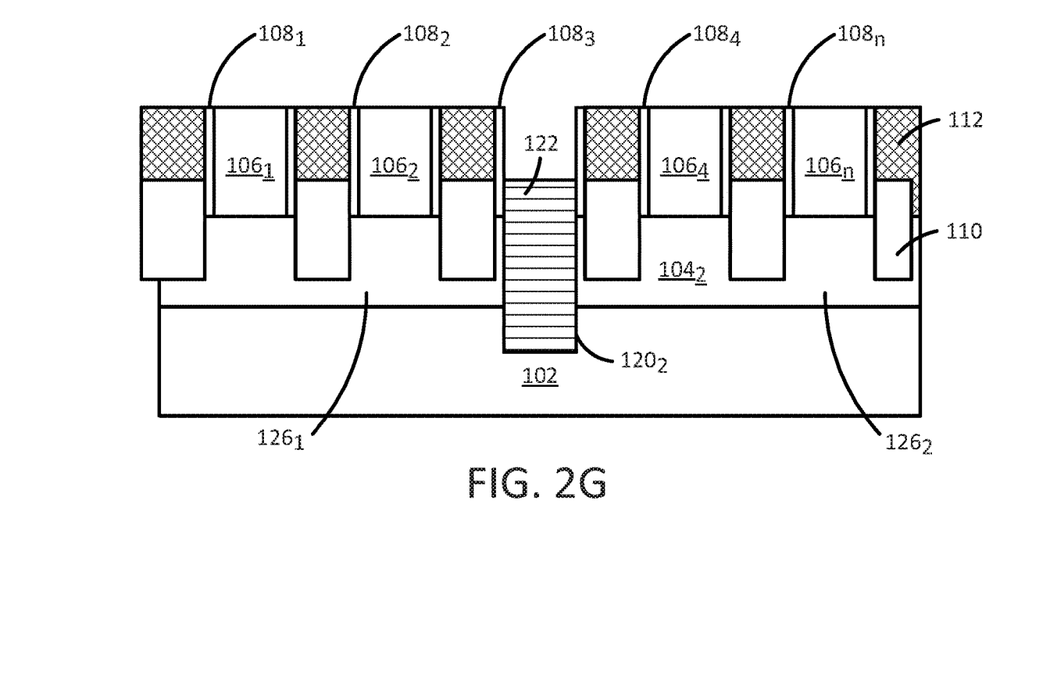
Figure 2H:
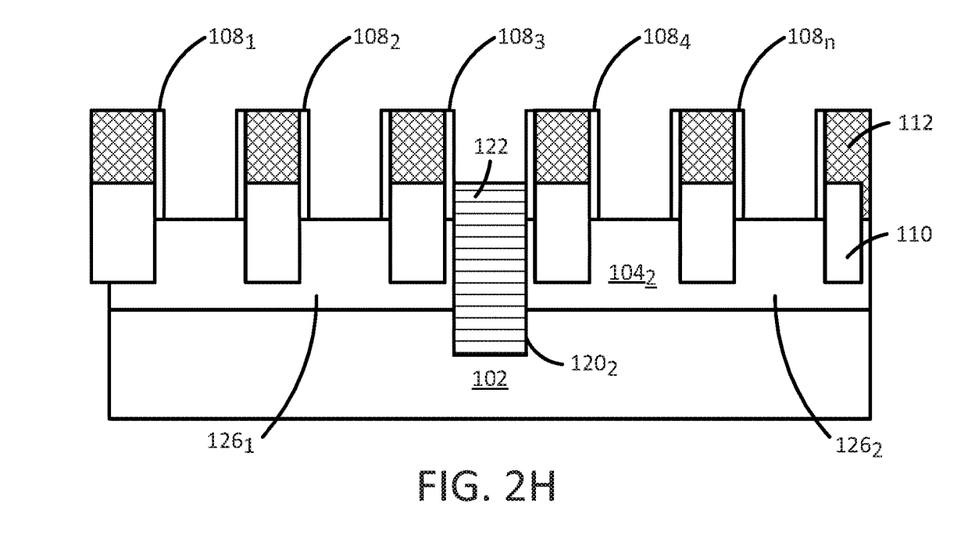
Figure 2I:
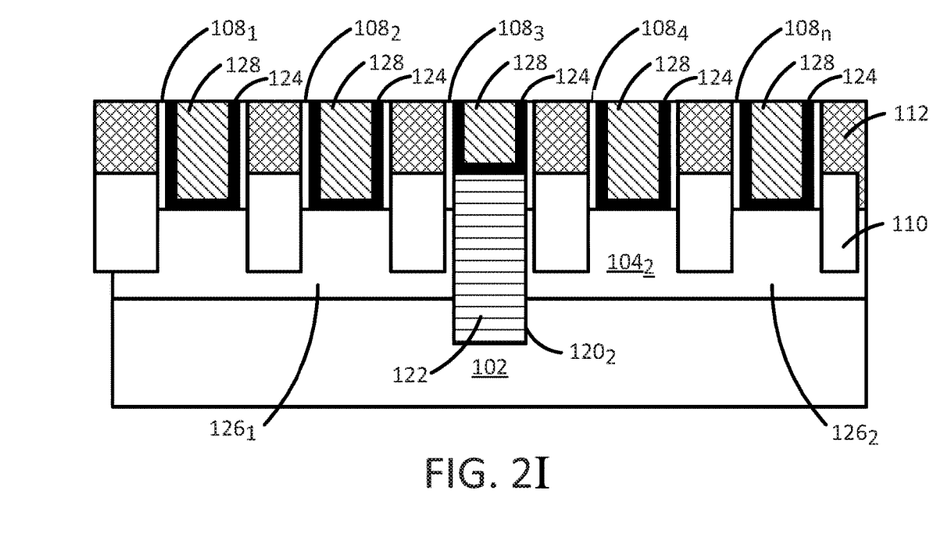
Figure 2J:
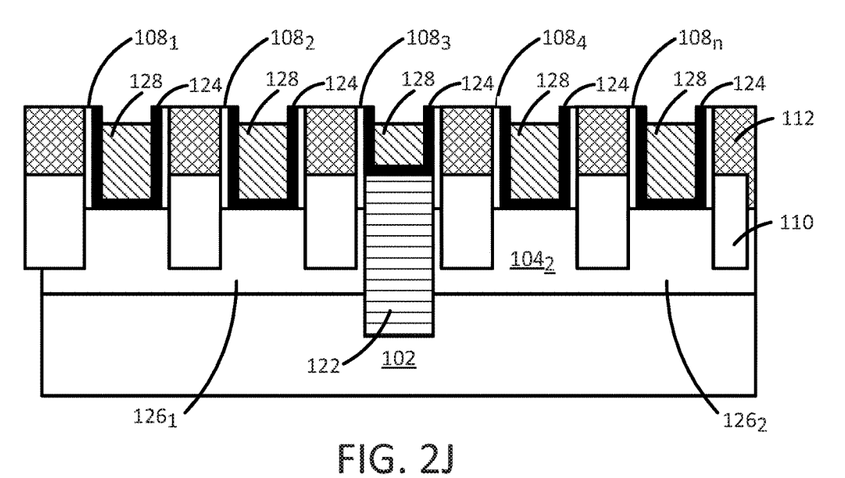
Figure 2K:
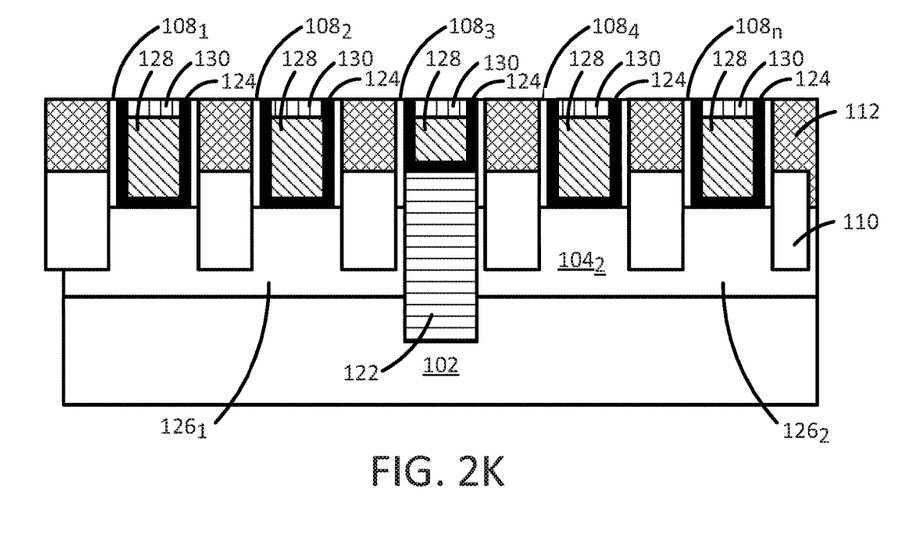
Figure 3G:
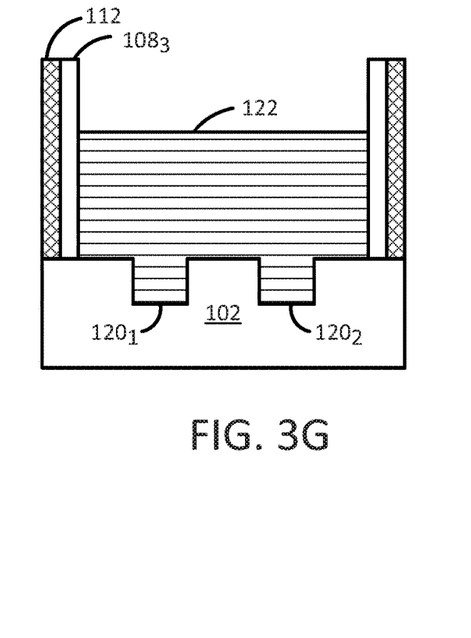
Figure 4C:
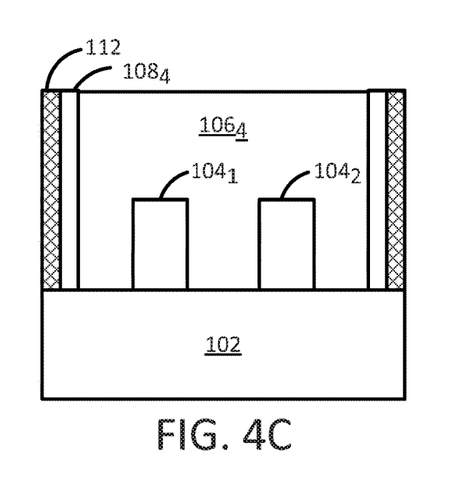
Figure 4D:
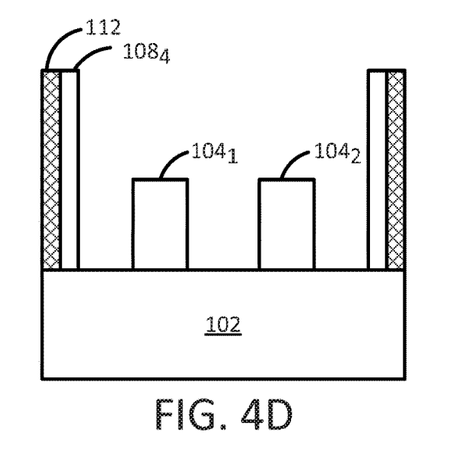
Figure 4E:
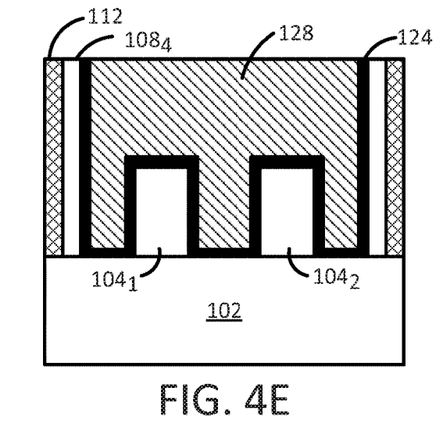

Referring to FIGS. 1G, 2G, 3G, and 4C, the etch mask 114 may next be removed. Then, the single diffusion break may be filled with a dielectric material 122, such as silicon nitride, silicon carbide, silicon oxynitride, carbon-doped silicon oxide, silicon-carbide-nitride, boron nitride, silicon boron nitride, silicoboron carbonitride, silicon oxycarbonitride, silicon oxide, or a combination thereof. The dielectric material 122 may fill the recesses 120 and the spaces where the removed first dummy gate $106_3$ sat. The dielectric material 122 may then be recessed, as shown in FIGS. 2G and 3G, so that the top surface of the dielectric material 122 is below the surface of the interlevel dielectric layer 112 and the surfaces of the remaining dummy gates 106. In one example, the dielectric material 122 may be recessed to any depth, so long as the top surface of the dielectric material 122 sits higher than the top surfaces of the fins 104, as shown in FIG. 2G. As shown in FIG. 4C, no substantial change is made to the remaining dummy gates 106 (i.e., dummy gates $106_1$, $106_2$, $106_4$, and $106_n$ in the illustrated example) in this step.

Figure 3H:
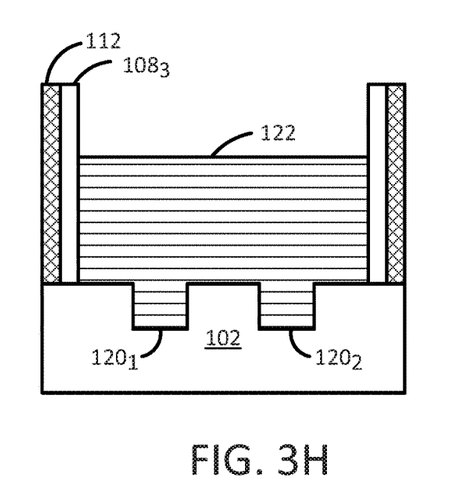
Figure 3I:
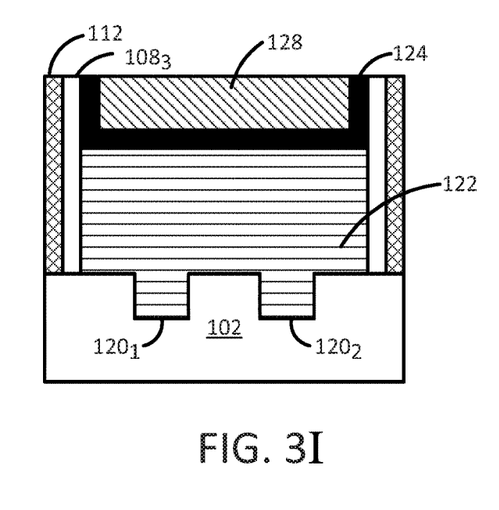

Referring to FIGS. 1H, 2H, 3H, and 4D, the remaining dummy gates 106 (i.e., dummy gates $106_1$, $106_2$, $106_4$, and $106_n$ in the illustrated example) may next be removed. This leaves a recess that extends down to the fins 104 in place of each of the remaining dummy gates 106. In one example, the remaining dummy gates 106 are removed via a RIE process. This is the start of a replacement metal gate process that will replace the remaining dummy gates 106 with active metal gates. As shown in FIG. 3H, no substantial change is made in the region of the diffusion break in this step.

Referring to FIGS. 1I, 2I, 3I, and 4E, a gate dielectric layer 124 may next be deposited over the substrate 102, over the fins 104, over the dielectric material 122, and over the spacers 108. The gate dielectric layer 124 may be formed of any suitable dielectric material, including, but not limited to, silicon oxide, silicon nitride, silicon oxynitride, high-k dielectric materials, or any combination thereof. In one example, high-k dielectric materials may include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants, including, but not limited to, lanthanum, aluminum, and magnesium. The gate dielectric layer 124 may be formed by any suitable process or combination of processes, including, but not limited to, thermal oxidation, chemical oxidation, thermal nitridation, plasma oxidation, plasma nitridation, atomic layer deposition, chemical vapor deposition, and the like. In some examples the thickness of the gate dielectric layer 124 is between one and five nanometers, although thicknesses outside of this range are also possible.

Next, gate conductor layer 128 may be deposited over the gate dielectric layer 124 and planarized (e.g., by chemical mechanical planarization) down to the surface of the interlevel dielectric layer 112. The gate conductor layer 128 may be formed of any suitable conducting material, including, but not limited to, doped polycrystalline or amorphous silicon, germanium, silicon germanium, a metal (e.g., tungsten, titanium, tantalum, ruthenium, hafnium, zirconium, cobalt, nickel, copper, aluminum, platinum, tin, silver, or gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, or nickel silicide), a transition metal aluminide ($Ti_3AL$ or zirconium aluminum), tantalum carbide, tantalum magnesium carbide, carbon nanotube, conductive carbon, graphene, or a combination thereof. The conducting material may further comprise dopants that are incorporated during or after deposition. The gate conductor layer 128 may be formed by any suitable process or combination of processes, including, but not limited to, atomic layer deposition, chemical vapor deposition, physical vapor deposition, sputtering, plating, evaporation, ion beam deposition, electron beam deposition, laser-assisted deposition, chemical solution deposition, or a combination thereof.

In some examples, a work function setting layer (not shown) may be positioned between the date dielectric layer 124 and the gate conductor layer 128. The work function setting layer may be formed of a work function metal (WFM), which may be any suitable metal, including, but not limited to, a nitride (e.g., titanium nitride, titanium aluminum nitride, hafnium nitride, hafnium silicon nitride, tantalum nitride, tantalum silicon nitride, tungsten nitride, molybdenum nitride, or niobium nitride), a carbide (e.g., titanium carbide, titanium aluminum carbide, tantalum carbide, or hafnium carbide), or combinations thereof. In some examples, a conductive material or a combination of conductive materials may serve as both the gate conductor layer 128 and the work function setting layer. The work function setting layer may be formed by any suitable process or combination of processes, including, but not limited to, atomic layer deposition, chemical vapor deposition, physical vapor deposition, sputtering, plating, evaporation, ion beam deposition, electron beam deposition, laser-assisted deposition, chemical solution deposition, or a combination thereof.

Notably, the gate dielectric layer 124 and the gate conductor layer 128 are both formed in the region of the diffusion break (i.e., where the first dummy gate $106_3$ originally sat), as well as in the regions where the remaining dummy gates 106 originally sat. In the region of the diffusion break, the gate dielectric layer 124 and the gate conductor layer 128 form an inactive gate above the dielectric material 122; collectively the dielectric material 122 and the inactive gate formed above the dielectric material form a dummy gate. However, in the regions where the remaining dummy gates 106 originally sat, the gate dielectric layer 124 and the gate conductor layer 128 form active gates. Thus, the dielectric material 122 in the region of the diffusion break does not interfere with the replacement metal gate process for the active gates.

Figure 3J:
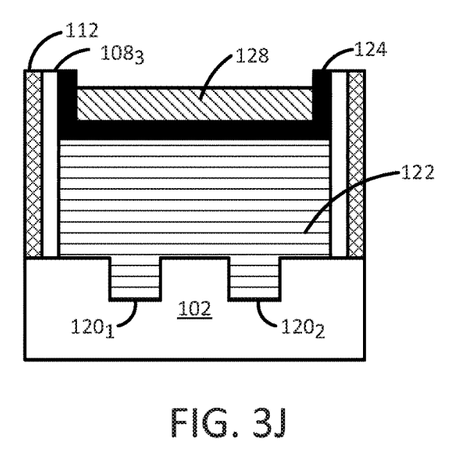
Figure 4F:
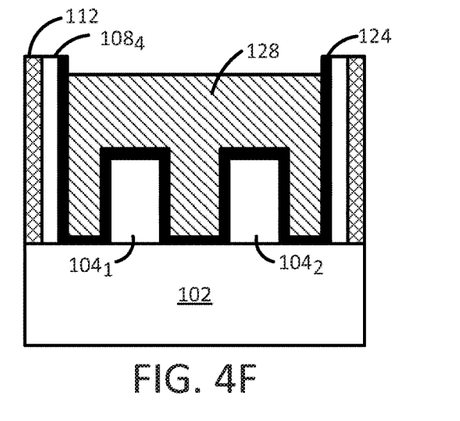

Referring to FIGS. 1J, 2J, 3J, and 4F, the gate conductor layer 128 may next be recessed in all gates (i.e., including the inactive gate in the diffusion break and all active gates in the fin arrays 126. In one example, because the inactive gate in the diffusion break also includes the gate conductor layer 128, this step may be performed at once for all of the gates, so that all of the gates are recessed uniformly (e.g., as shown in FIGS. 3J and 4F).

Figure 3K:
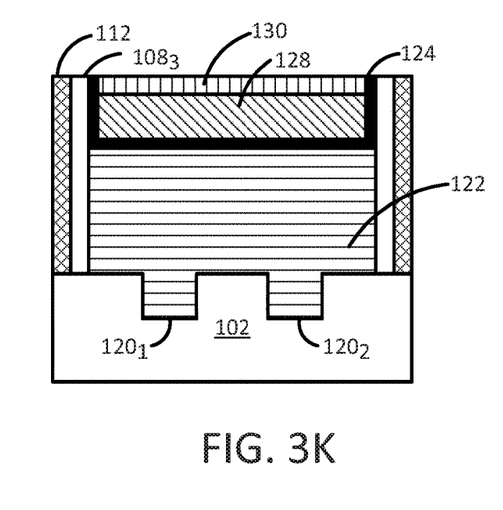
Figure 3L:
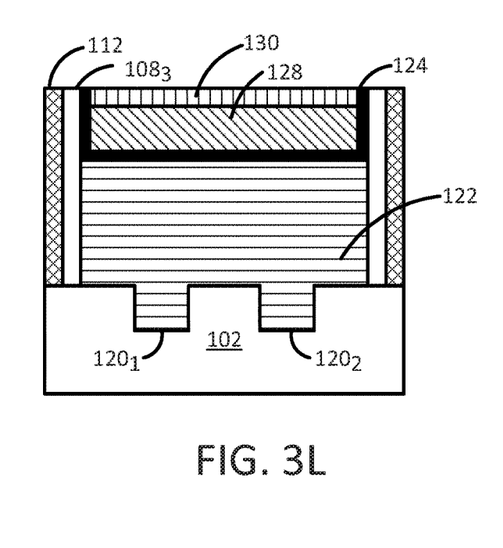
Figure 3M:
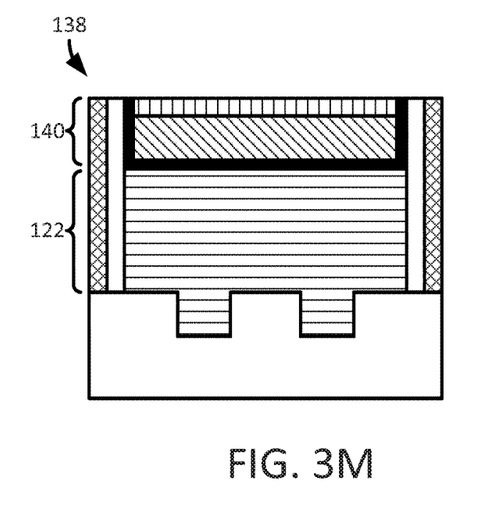
Figure 4G:
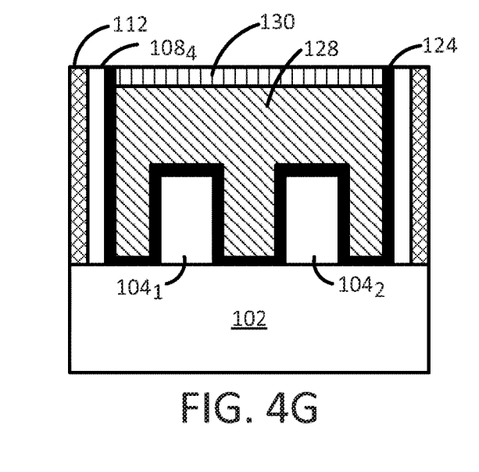
Figure 4H:
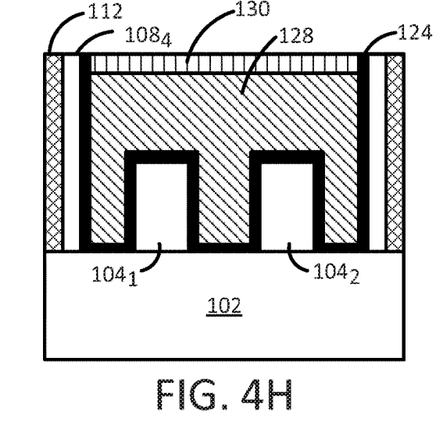
Figure 4I:
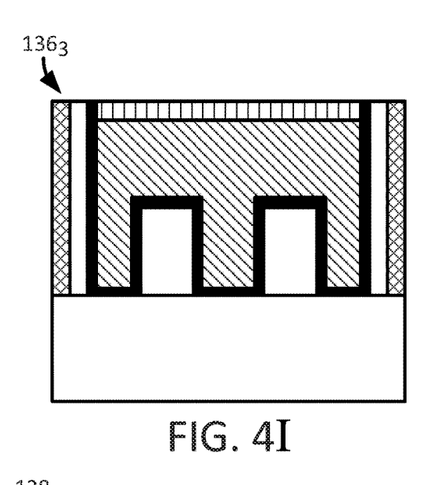

Referring to FIGS. 1K, 2K, 3K, and 4G, a gate cap layer 130 may next be deposited over the gate conductor layer 128 that was just recessed. The gate cap layer 130 may be formed, for example, from a dielectric material such as silicon nitride. In one example, the gate cap layer 130 is deposited and then planarized down to the level of the interlevel dielectric layer 112. Again, because the inactive gate in the diffusion break also includes a gate conductor layer 128 that is recessed uniformly with the gate conductor layer 128 of the active gates, this step may be performed at once for all of the gates, so that all of the gates are capped uniformly (e.g., as shown in FIGS. 3K and 4G).

Figure 1L:
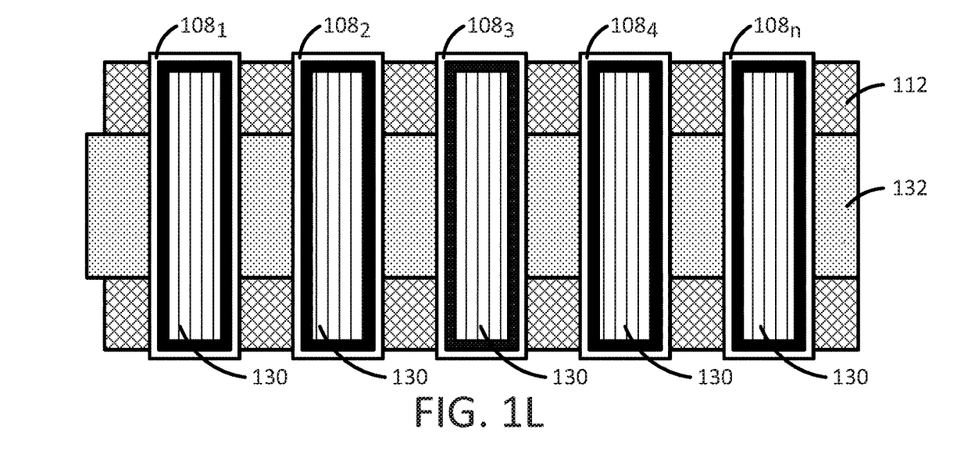
Figure 1M:
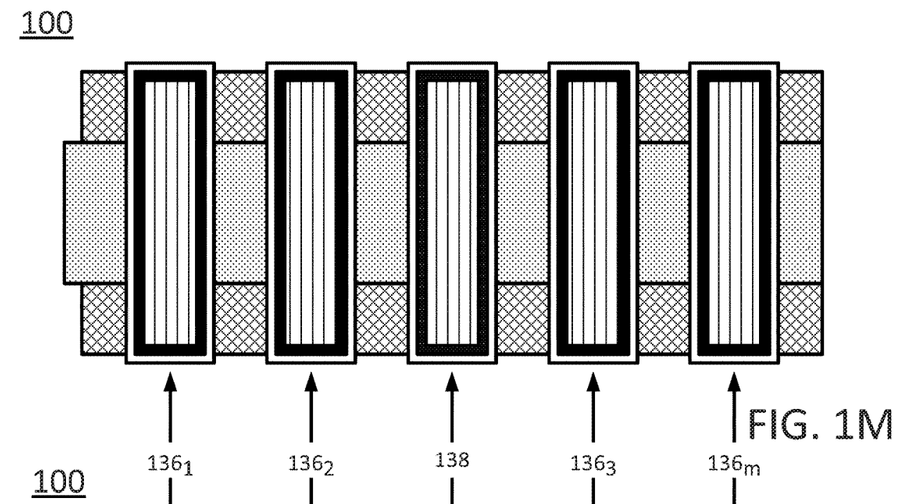
Figure 2L:
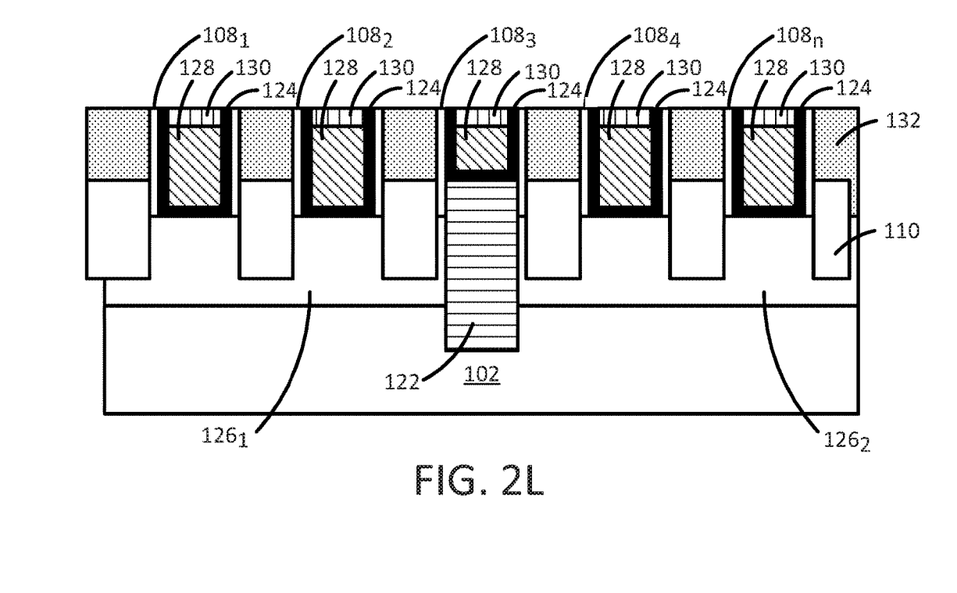
Figure 2M:
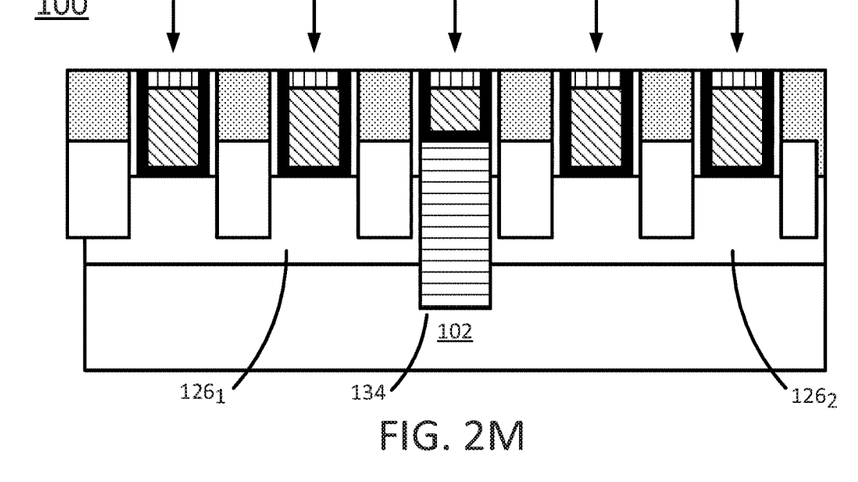

Referring to FIGS. 1L, 2L, 3L, and 4H, source and drain contacts 132 may next be formed over the epitaxial layer 110. In one example, formation of the source and drain contacts comprises depositing a conductive material over the epitaxial layer 110, in the spaces between the gates and at the ends of the FET 100, as shown in FIGS. 1L and 2L. In particular, a first set of source and drain contacts may be formed in the spaces between the active gates of the first fin array $126_1$, while a second set of source and drain contacts may be formed in the spaces between the active gates of the second fin array $126_2$. The source and drain contacts 132 may be formed of any suitable conducting material, including, but not limited to, tungsten, aluminum, copper, cobalt, nickel, titanium, or a combination thereof. The source and drain contacts 132 may further include a barrier layer formed, for example, of titanium nitride, tantalum nitride, hafnium nitride, niobium nitride, tungsten nitride, carbon nanotubes, graphene, or a combination thereof. The barrier layer may minimize diffusion and/or alloying of the conducting material with the top source/drain contact material and/or anode/cathode material. In various examples, the barrier layer may be conformally deposited by atomic layer deposition, chemical vapor deposition, metal organic chemical vapor deposition, plasma enhanced chemical vapor deposition, or a combination thereof. In various examples, the conducting material can be deposited by atomic layer deposition, chemical vapor deposition, physical vapor deposition, or a combination thereof to form the source/drain contacts 132.

The resulting FET 100, as illustrated in 1M, 2M, 3M, and 4I therefore includes a single diffusion break 134 between the adjacent fin arrays 126 (e.g., first fin array $126_1$ and second fin array $126_2$) that support the active gates $136_1$-$136_m$ (hereinafter individually referred to as an 'active gate 136" or collectively referred to as "active gates 136"). The single diffusion break 134 is recessed to a depth that is lower than the bottom surfaces of the fins (e.g., partially into the substrate 102 supporting the fins). A dummy gate 138, comprising a lower layer of a dielectric fill (i.e., dielectric material 122) and an upper layer of an inactive gate 140 (comprising gate dielectric layer 124, gate conductor layer 128, and gate cap layer 130), is formed in the recess. This stands in contrast to conventional single diffusion break fabrication processes, which form the dummy gate in the diffusion break entirely from a dielectric material. As discussed above, separate fabrication of the dummy gate and the active gates in the conventional manner may interfere with subsequent downstream processing of the active gates. However, including the upper layer of the inactive gate 140 in the dummy gate 138 of the disclosed FET 100 allows the dummy gate 138 and the active gates 136 to be fabricated simultaneously (e.g., processed in the same way at the same time) during downstream processing, in a common series of processing steps. This, in turn, minimizes interference with formation of the active gates 136. Thus, variability among FET devices fabricated according to the disclosed process is minimized.

Although various embodiments which incorporate the teachings of the present invention have been shown and described in detail herein, those skilled in the art can readily devise many other varied embodiments that still incorporate these teachings.

What is claimed is:

1. A field effect transistor, comprising:
   a first transistor array comprising a first active gate;
   a second transistor array comprising a second active gate; and
   a single diffusion break formed between the first transistor array and the second transistor array, wherein the single diffusion break comprises a dummy gate comprising a layer of dielectric material, and an inactive gate structure formed over the layer of dielectric material, wherein a lateral width of the layer of dielectric material is substantially equal to a lateral width of the inactive gate structure,
   wherein a sidewall spacer directly contacts and separates the layer of dielectric material from an adjacent epitaxial source drain region.

2. The field effect transistor of claim 1,
   wherein the first transistor array further comprises:
      a first channel formed as a first fin, where the first active gate wraps around the first fin, and
   wherein the second transistor array further comprises:
      a second channel formed as a second fin, where the second active gate wraps around the second fin.

3. The field effect transistor of claim 2, wherein a top surface of the layer of the dielectric material sits higher than top surfaces of the first fin and the second fin.

4. The field effect transistor of claim 1, wherein upper most surfaces of both the layer of dielectric material and the adjacent epitaxial source drain region are above a lower most surface of the sidewall spacer.

5. The field effect transistor of claim 4, further comprising:
a semiconductor substrate on which the first transistor array, the second transistor array, and the single diffusion break are formed,
wherein the layer of the dielectric material fills a recess formed in a portion of the semiconductor substrate, the recess corresponding with a size and a location of a first fin and a second fin.

6. The field effect transistor of claim 5, wherein a depth of the recess is lower than a depth to which bottom surfaces of the first transistor array and the second transistor array reach.

7. The field effect transistor of claim 1, wherein the inactive gate, the first active gate, and the second active gate are formed from identical materials.

8. The field effect transistor of claim 7, wherein the identical materials comprise:
a gate dielectric layer;
a gate conductor layer formed over the gate dielectric layer; and
a gate cap layer formed over the gate conductor layer.

9. The semiconductor structure of claim 1, wherein sidewalls of the single dielectric material are coplanar with sidewalls of the one gate structure.

10. A field effect transistor, comprising:
a substrate;
a first transistor array formed on the substrate, comprising:
a first channel formed as a first fin;
a first active gate wrapping around the first fin;
a second transistor array formed on the substrate, comprising:
a second channel formed as a second fin;
a second active gate wrapping around the second fin; and
a single diffusion break formed between the first transistor array and the second transistor array, the single diffusion break comprising:
a layer of dielectric material, wherein a top surface of the layer of the dielectric material sits higher than top surfaces of the first fin and the second fin; and
an inactive gate formed over the layer of dielectric material, wherein the inactive gate, the first active gate, and the second active gate are formed from identical materials,
wherein a lateral width of the layer of dielectric material is substantially equal to a lateral width of the inactive gate,
wherein upper most surfaces of both the layer of dielectric material and adjacent epitaxial source drain regions are above a lower most surface of a sidewall spacer separating the layer of dielectric material from the adjacent epitaxial source drain regions.

11. The field effect transistor of claim 10, wherein the layer of dielectric material fills a recess in a portion of the substrate, and the recess sits at a depth that is lower than a depth to which bottom surfaces of the first fin and the second fin reach.

12. The field effect transistor of claim 10, wherein the identical materials comprise:
a gate dielectric layer;
a gate conductor layer formed over the gate dielectric layer; and
a gate cap layer formed over the gate conductor layer,
wherein upper most surfaces of the gate cap layer above each of the inactive gate, the first active gate, and the second active gate are substantially flush with one another.

13. A semiconductor structure comprising:
a first array of fins and a second array of fins on a substrate;
an array of gate structures perpendicular to and wrapping portions of both the first array of fins and the second array of fins; and
a single dielectric material directly below one gate structure, the single dielectric material isolates the first array of fins from the second array of fins, wherein sidewalls of the single dielectric material are coplanar with sidewalls of the one gate structure.

14. The semiconductor structure of claim 13, wherein a portion of the single dielectric material extends downward into the substrate below the first array of fins and below the second array of fins, wherein the portion of the single dielectric material corresponds with a size and a location of opposing fins from the first array of fins and below the second array of fins.

15. The semiconductor structure of claim 13, wherein upper most surfaces of a gate cap, a gate dielectric, and a sidewall spacer are substantially flush with one another.

16. The semiconductor structure of claim 13, wherein upper most surfaces of both the single dielectric material and adjacent epitaxial source drain regions are above a lower most surface of a sidewall spacer separating the single dielectric material from the adjacent epitaxial source drain regions.

17. The semiconductor structure of claim 13, wherein a vertical sidewall of a gate dielectric layer of the one gate structure is in direct contact with a sidewall spacer, the sidewall spacer is in direct contact with a vertical sidewall of an adjacent epitaxial source drain region, and a bottom most surface of the sidewall spacer is below an upper most surface of the adjacent epitaxial source drain regions.

18. The semiconductor structure of claim 13, wherein a width of the single dielectric material is substantially equal to a width of the one gate structure.

19. The semiconductor structure of claim 13, wherein each gate of the array of gate structures comprises:
a gate dielectric layer;
a gate conductor layer formed over the gate dielectric layer; and
a gate cap layer formed over the gate conductor layer.

* * * * *